United States Patent
Lee et al.

(10) Patent No.: US 10,510,868 B2
(45) Date of Patent: *Dec. 17, 2019

(54) FIN FIELD-EFFECT TRANSISTORS AND METHODS OF FORMING THE SAME

(71) Applicant: Taiwan Semiconductor Manufacturing Company, Ltd., Hsinchu (TW)

(72) Inventors: Yi-Jing Lee, Hsinchu (TW); Ming-Hua Yu, Hsinchu (TW)

(73) Assignee: Taiwan Semiconductor Manufacutring Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/511,580

(22) Filed: Jul. 15, 2019

(65) Prior Publication Data

US 2019/0341471 A1   Nov. 7, 2019

Related U.S. Application Data

(63) Continuation of application No. 15/799,344, filed on Oct. 31, 2017, now Pat. No. 10,355,105.

(51) Int. Cl.
| | |
|---|---|
| *H01L 29/66* | (2006.01) |
| *H01L 29/78* | (2006.01) |
| *H04L 29/08* | (2006.01) |
| *H01L 29/08* | (2006.01) |

(52) U.S. Cl.
CPC .... *H01L 29/66636* (2013.01); *H01L 29/0847* (2013.01); *H01L 29/66545* (2013.01); *H01L 29/66553* (2013.01); *H01L 29/66795* (2013.01); *H01L 29/7851* (2013.01); *H01L 29/665* (2013.01)

(58) Field of Classification Search
CPC .......... H01L 29/66636; H01L 29/0847; H01L 29/66553; H01L 29/66795; H01L 29/7851
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,190,272 B1 | 11/2015 | Park et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2007/0051975 A1* | 3/2007 | Figuet | H01L 21/02381 257/183 |
| 2008/0227267 A1 | 9/2008 | Oosterlaken | |

(Continued)

*Primary Examiner* — Christine A Enad
(74) *Attorney, Agent, or Firm* — Slater Matsil, LLP

(57) ABSTRACT

A method includes forming first spacers on opposing sidewalls of a first fin, where the first fin protrudes above a substrate, recessing the first fin to form a first recess between the first spacers, and treating the first spacers using a baking process, where treating the first spacers changes a profile of the first spacers. The method further includes epitaxially growing a first semiconductor material over a top surface of the first fin after treating the first spacers.

20 Claims, 20 Drawing Sheets

(56) References Cited

U.S. PATENT DOCUMENTS

| | | | |
|---|---|---|---|
| 2008/0237712 A1* | 10/2008 | Wei | H01L 21/84 |
| | | | 257/347 |
| 2008/0265321 A1* | 10/2008 | Yu | H01L 21/26586 |
| | | | 257/344 |
| 2010/0052043 A1* | 3/2010 | Lee | H01L 27/115 |
| | | | 257/325 |
| 2010/0200897 A1* | 8/2010 | Heringa | H01L 21/2652 |
| | | | 257/288 |
| 2012/0052647 A1 | 3/2012 | Kim et al. | |
| 2012/0111831 A1* | 5/2012 | Ha | C23C 16/325 |
| | | | 216/37 |
| 2012/0244674 A1 | 9/2012 | Kim et al. | |
| 2015/0187634 A1 | 7/2015 | Chiang et al. | |
| 2015/0200271 A1 | 7/2015 | Lee et al. | |
| 2015/0214366 A1 | 7/2015 | Chang et al. | |
| 2015/0243745 A1 | 8/2015 | Kelly et al. | |
| 2017/0148881 A1 | 5/2017 | Zhu | |
| 2017/0288032 A1 | 10/2017 | Lu et al. | |
| 2018/0350934 A1 | 12/2018 | Liou et al. | |

\* cited by examiner

FIN FIELD-EFFECT TRANSISTORS AND METHODS OF FORMING THE SAME

PRIORITY CLAIM AND CROSS-REFERENCE

This application is a continuation of U.S. patent application Ser. No. 15/799,344, filed on Oct. 31, 2017, and entitled "Fin Field-Effect Transistors and Methods of Forming the Same," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming the epitaxial source/drain regions of a multiple-fin FinFET device. In accordance with some embodiments, prior to epitaxially growing the source/drain material, a pre-bake process is performed to reshape the spacers on opposing sides of each of the fins. In some embodiments, the pre-bake process curves the inner sidewalls of the spacers to facilitate horizontal growth of the epitaxial source/drain material, and therefore, results in merged source/drain regions with increased volume over the multiple fins. The increased volume of the merge source/drain regions allows for reliable connection with source/drain contact plugs formed subsequently, lower contact resistance, and reduces the possibility of etch through of the source/drain region during formation of the source/drain contact plugs, in some embodiments.

Figure 1:
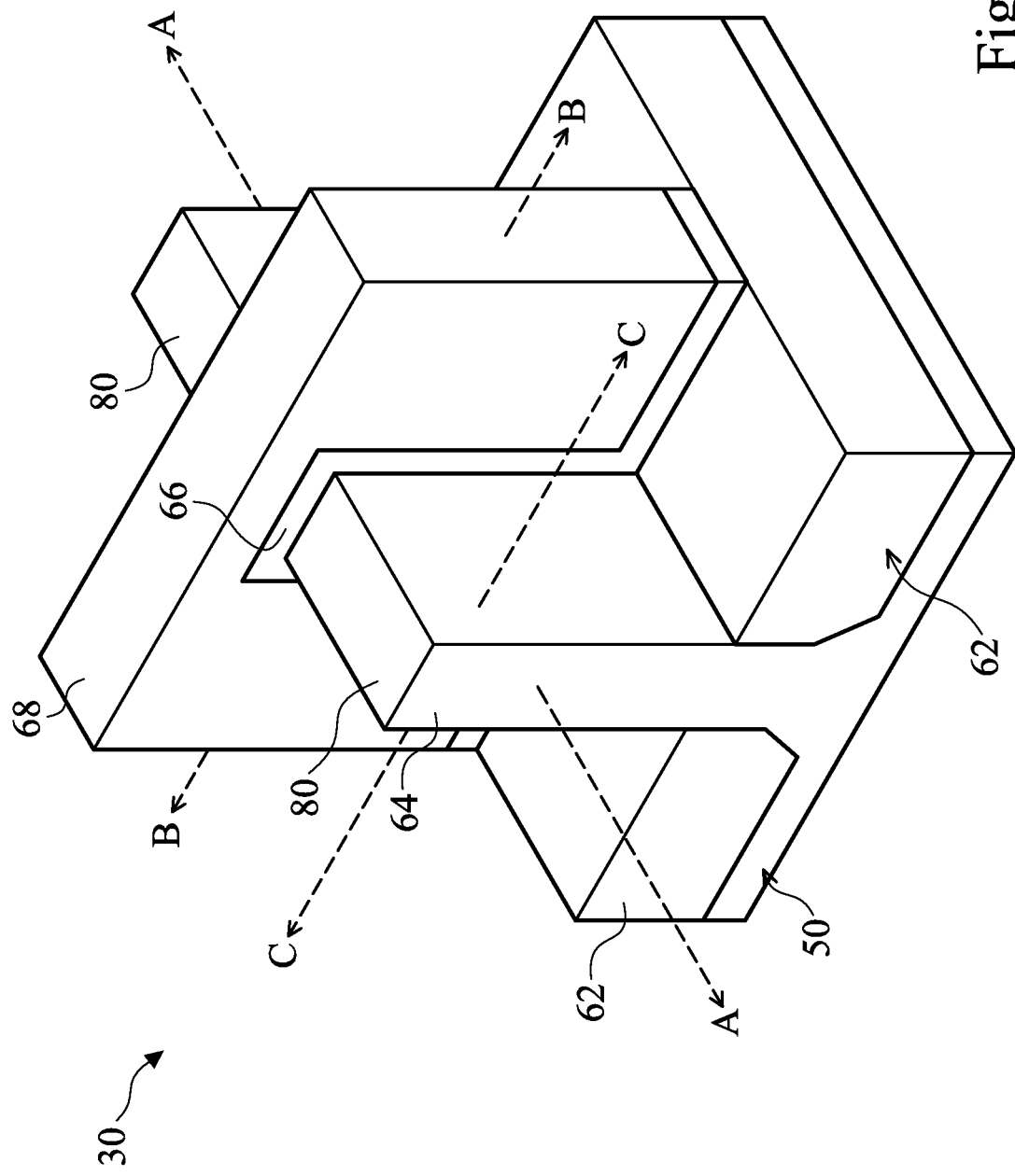
FIG. 1 illustrates a perspective view of a Fin Field-Effect Transistor (FinFET), in accordance with some embodiments.

FIG. 1 illustrates an example of a FinFET 30 in a perspective view. The FinFET 30 includes a substrate 50 having a fin 64. The fin 64 protrudes above neighboring isolation regions 62 disposed on opposing sides of the fin 64. A gate dielectric 66 is along sidewalls and over a top surface of the fin 64, and a gate 68 is over the gate dielectric 66. Source/drain regions 80 are in the fin 64 on opposite sides of the gate dielectric 66 and gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

Figure 6A:
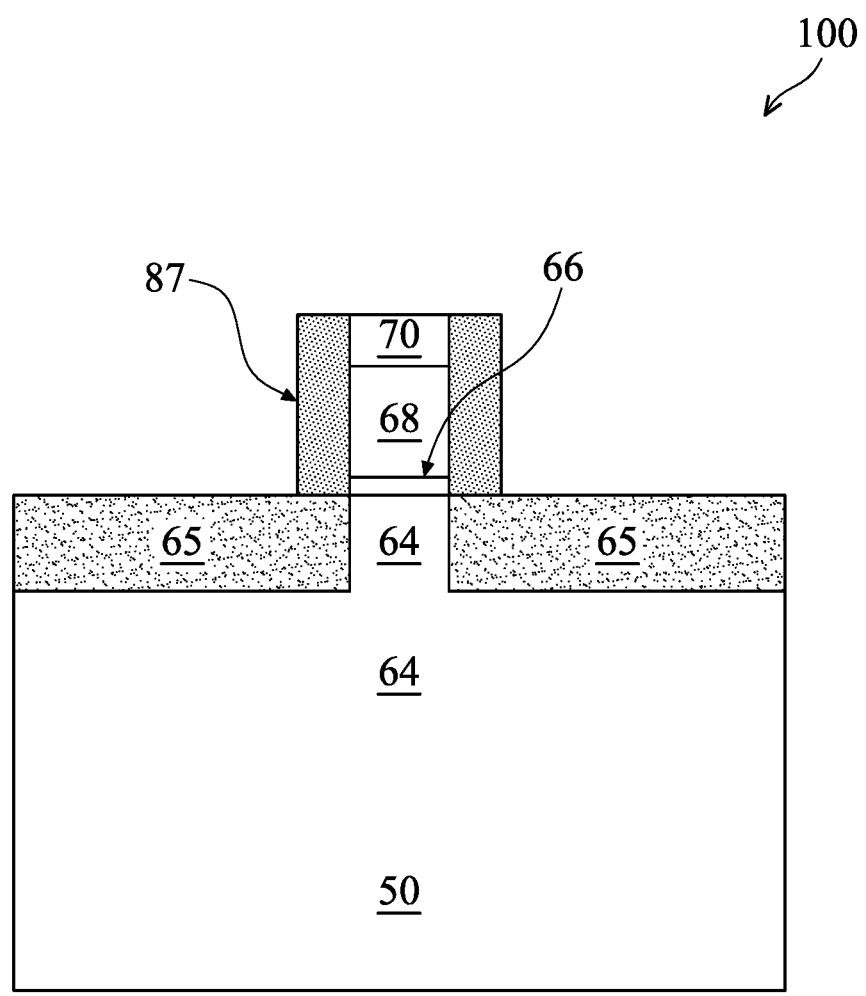
Figure 6B:
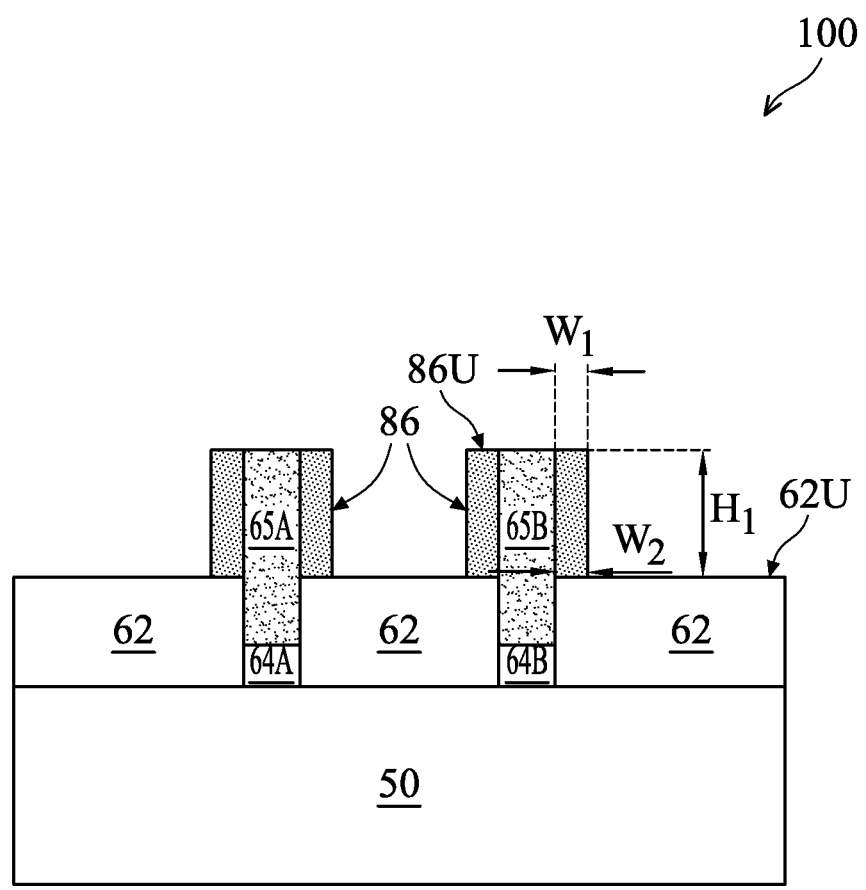
Figure 7A:
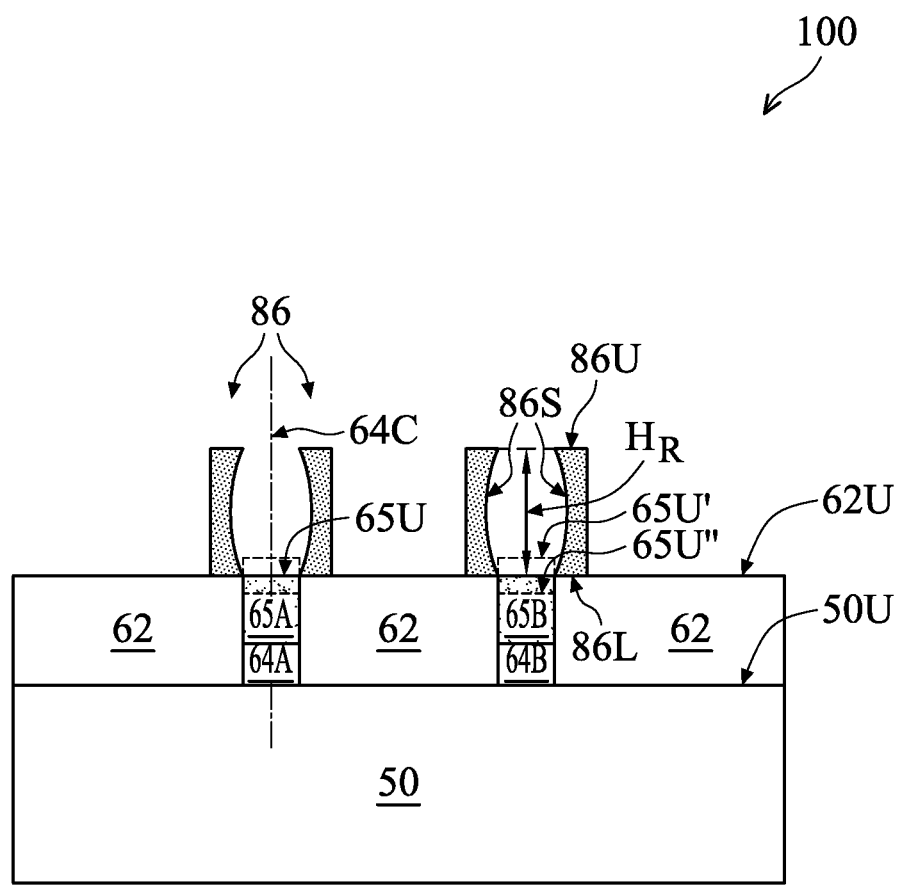
Figure 7C:
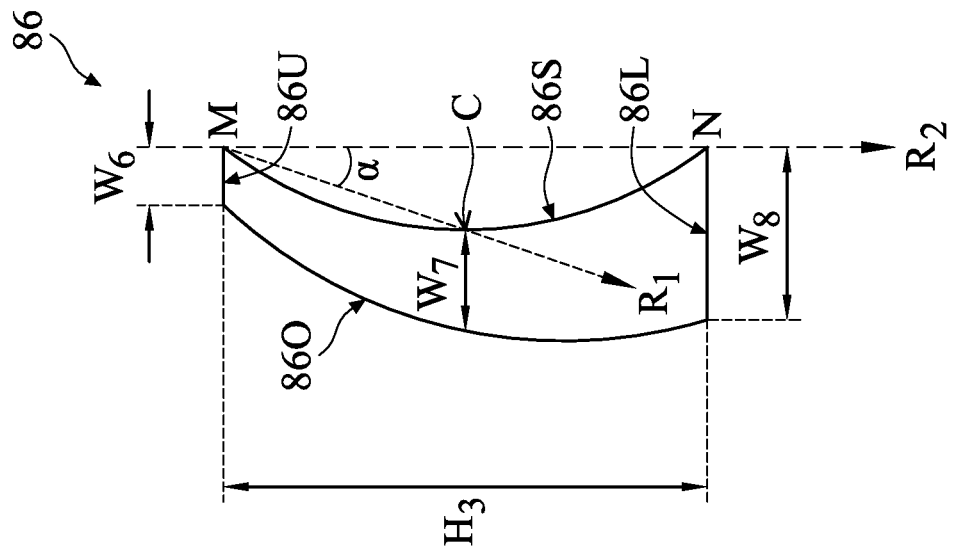
Figure 7B:
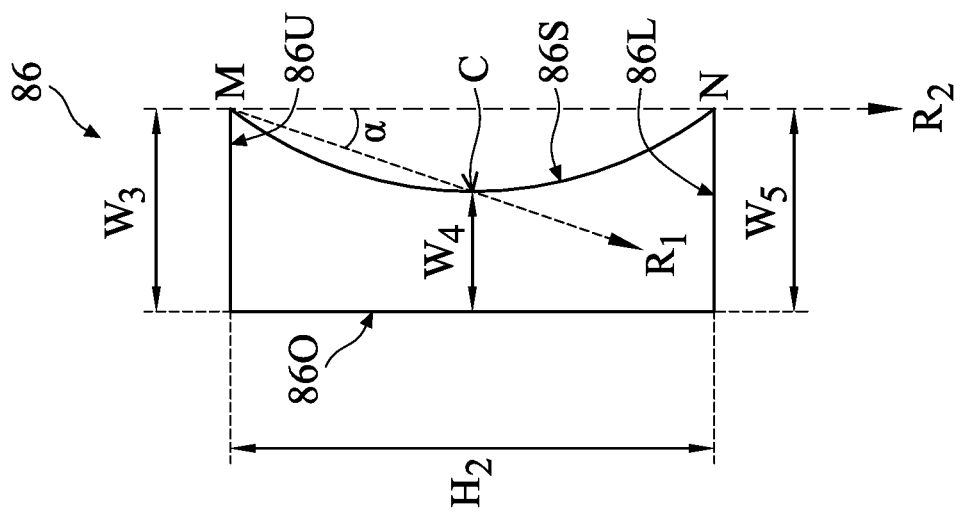
Figure 8A:
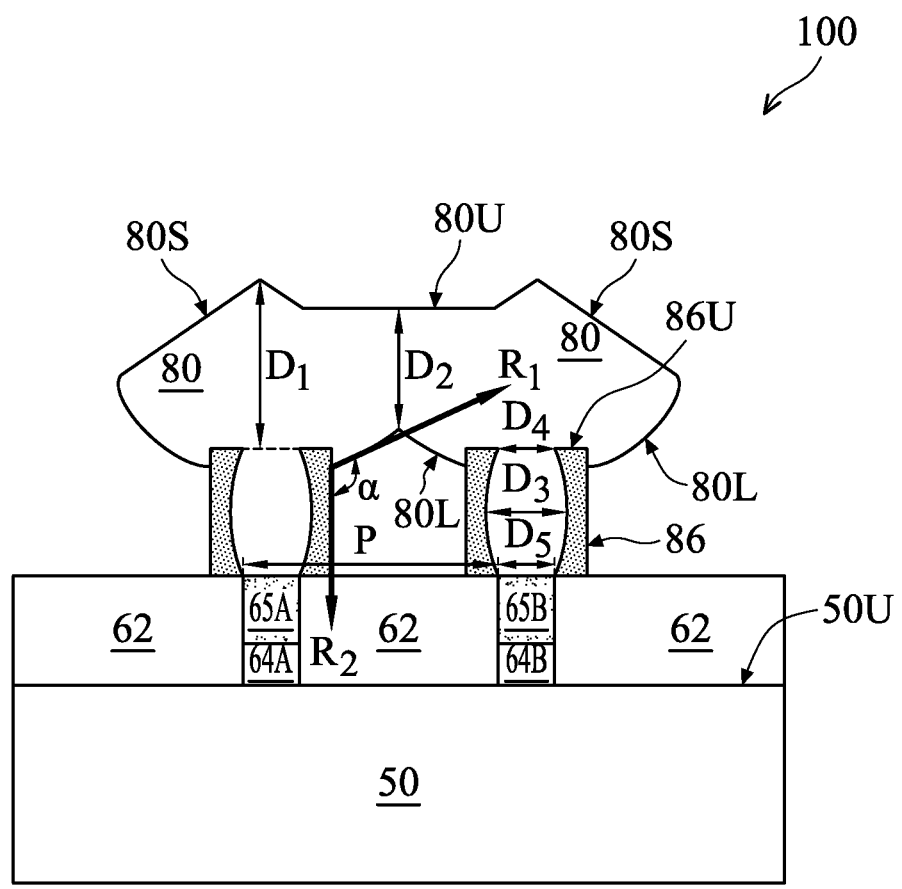
Figure 8B:
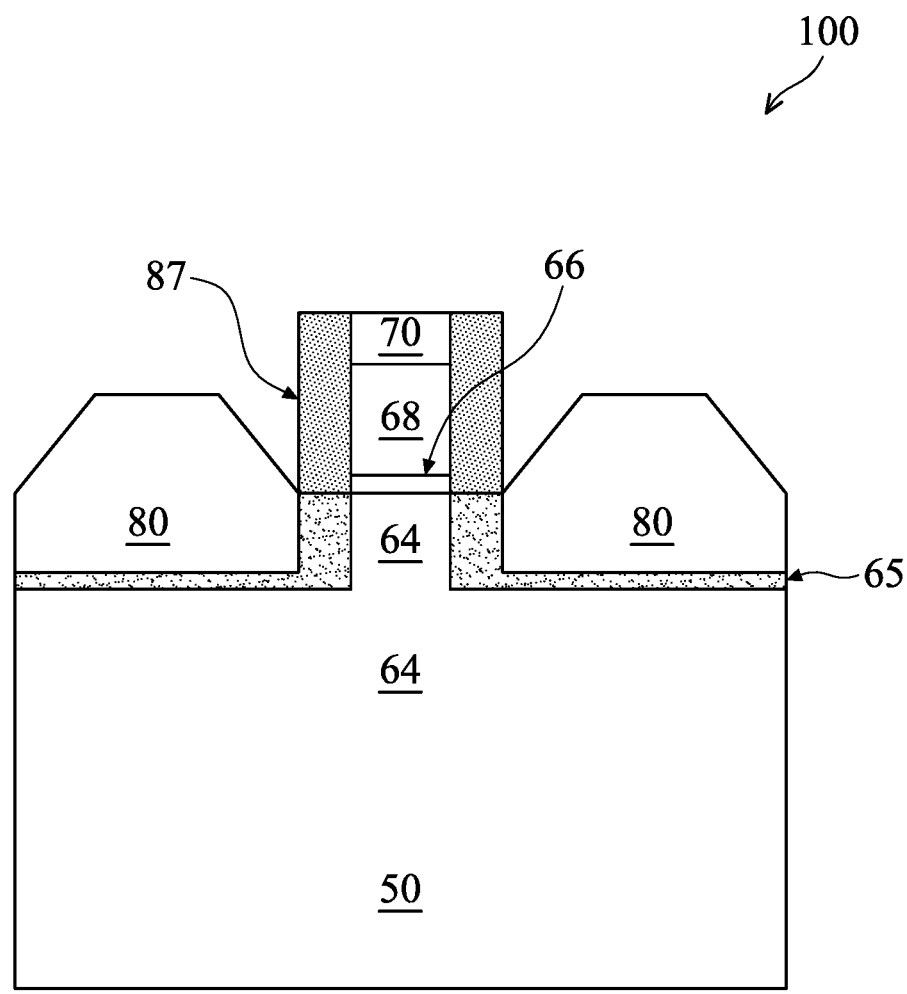

FIGS. 2-5, 6A, 6B, 7A, 7B, 7C, 8A, 8B, 9-14, 15A, and 15B illustrate various views of a FinFET device 100 at various stages of fabrication, in accordance with some embodiments. The FinFET device 100 is similar to the FinFET 30 in FIG. 1, except for multiple fins. FIGS. 2-5 illustrate cross-section views of the FinFET device 100 along cross-section B-B. FIGS. 6A and 6B illustrate cross-sectional views of the FinFET device 100 along cross-sections A-A and C-C, respectively. FIG. 7A illustrates cross-sectional view of the FinFET device 100 along cross-sections C-C, and FIGS. 7B and 7C illustrate zoomed-in views of the spacers of the FinFET device 100 in FIG. 7A in various embodiments. FIGS. 8A and 8B illustrate cross-sectional views of the FinFET device 100 along cross-sections C-C and A-A, respectively. FIGS. 9-14 and 15A illustrate cross-sectional views of the FinFET device 100 along cross-section A-A, and FIG. 15B illustrates cross-sectional view of the FinFET device 100 along cross-section C-C.

Figure 2:
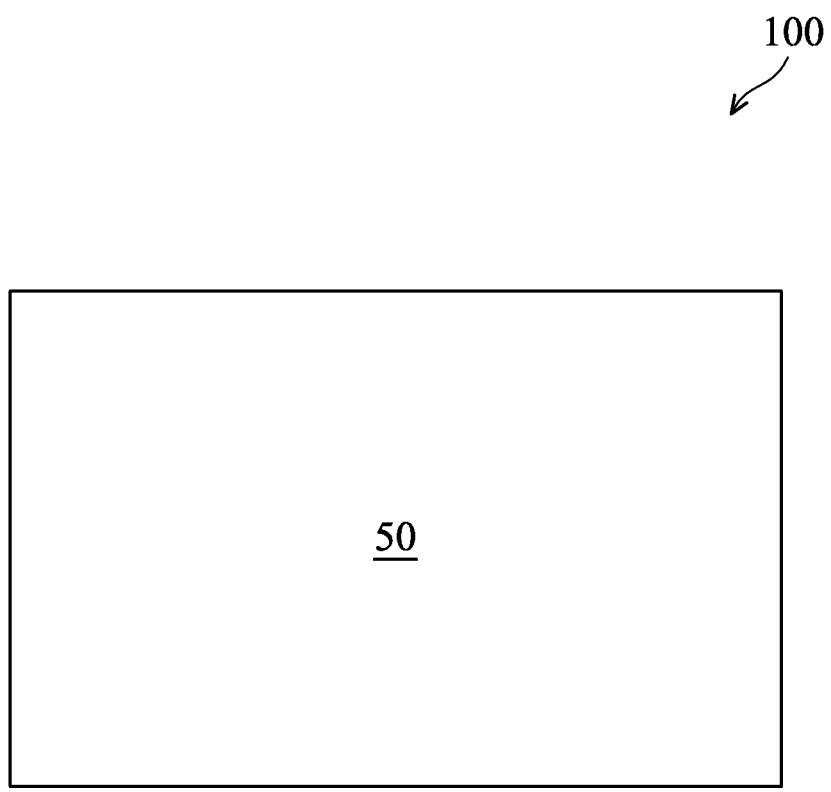
FIGS. 2-5, 6A, 6B, 7A, 7B, 7C, 8A, 8B, 9-14, 15A, and 15B illustrate various views of a FinFET device at various stages of fabrication, in accordance with some embodiments.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
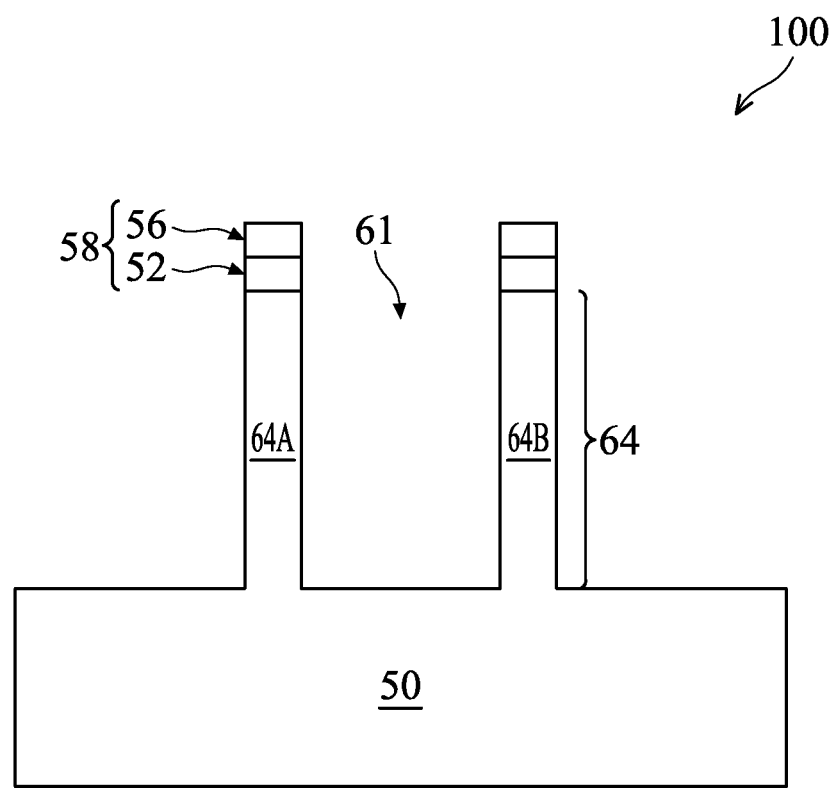

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., fin 64A and fin 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from the top) parallel to each other, and closely spaced with respect to each other. In some embodiments, the trenches 61 may be continuous and surround the semiconductor fins 64. Although two fins 64 are illustrated in FIG. 3 and subsequent drawings, more or less than two fins may be formed for the FinFET device 100.

The fins 64 may be patterned by any suitable method. For example, the fins may 64 be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
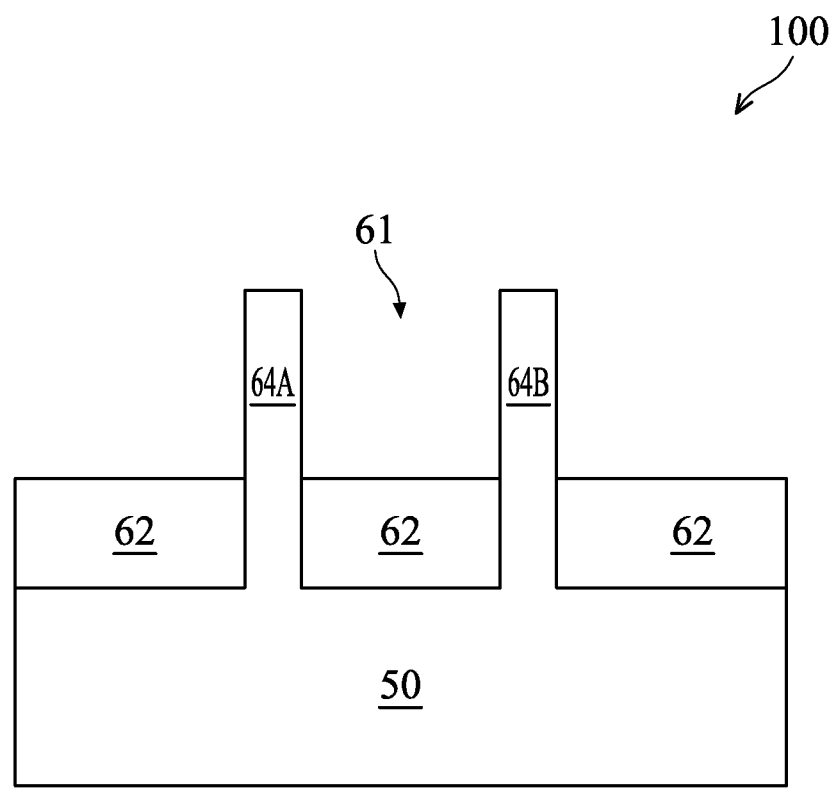

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor fins can be recessed, and a material different from the semiconductor fins may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
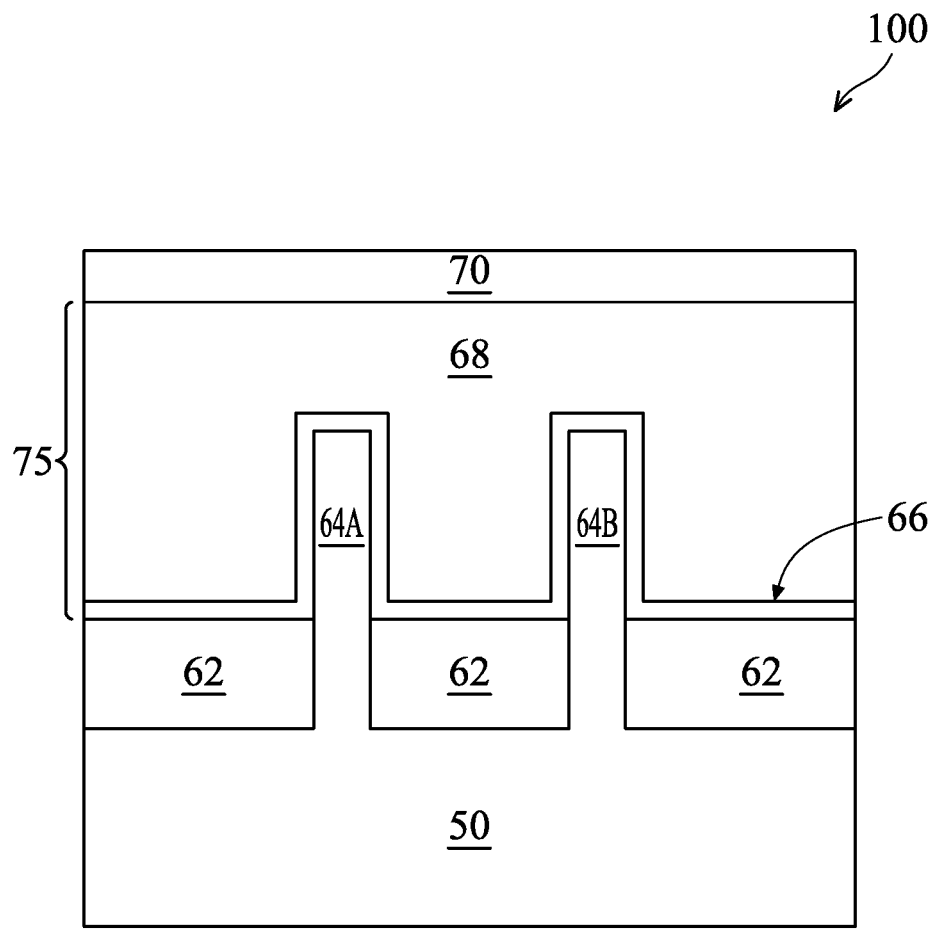

FIG. 5 illustrates the formation of dummy gate structure 75 over the semiconductor fins 64. Dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown according to acceptable techniques.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

FIG. 6A illustrates the cross-section view of further processing of the FinFET device 100 along cross-section A-A (e.g., along a longitudinal axis of the fin 64), FIG. 6B illustrates the cross-section view of the FinFET device 100 shown in FIG. 6A, but along cross-section C-C.

As illustrated in FIG. 6A, lightly doped drain (LDD) regions 65 are formed in the fins 64. The LDD regions 65 may be formed by a plasma doping process. The plasma doping process may implant N-type or P-type impurities in the fins 64 to form the LDD regions 65. For example, P-type impurities, such as boron, may be implanted in the fins 64 to form the LDD regions 65 for a P-type device, and N-type impurities, such as phosphorus, may be implanted in the fins 64 to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6A illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6A, after the LDD regions 65 are formed, gate spacers 87 are formed on the dummy gate structure 75. The gate spacers 87 may be formed of a suitable material such as silicon nitride, silicon oxynitride, silicon carbide, silicon carbonitride, the like, or a combination thereof, and may be formed using, e.g., a thermal oxidation, CVD, or other suitable deposition process. In some embodiments, the gate spacers 87 are formed by blanket depositing a nitride layer over the FinFET device 100, then performing a suitable etching process, such as an anisotropic etch, to remove the nitride layer from the upper surface of the dummy gate structure 75 and from the upper surface of the fins 64. Portions of the nitride layer along sidewalls of the dummy gate structure 75 remain to form the gate spacers 87, in some embodiments. Portions of the nitride layer along sidewalls of the fins 64 may also remain to form fin spacer 86 (see FIG. 6B). In the discussion below, the fin spacers 86 may also be referred to as spacers.

FIG. 6B illustrates the FinFET device 100 along cross-section C-C. As illustrated in FIG. 6B, spacers 86 are formed over the STI regions 62 and on opposing sidewalls of the fins 64A and 64B. Note that since the LDD regions 65 are doped regions of the fins 64 in the illustrated embodiments, the description herein may consider the LDD regions 65 as part of the fins 64. In some embodiments, a height $H_1$ of the spacers 86 is in a range from about 5 nm to about 30 nm, a width $W_1$ of the spacer 86 measured at an upper surface 86U of the spacers 86 is in a range from about 2 nm to about 5 nm, and a width $W_2$ of the spacers 86 measured at an upper surface 62U of the STI regions 62 is in a range from about 2 nm to about 8 nm, although other dimensions are also possible.

Referring now to FIG. 7A, which illustrates the FinFET device 100 along cross-section C-C, the fins 64 (e.g., the LDD regions 65 of the fins 64) are recessed by a suitable process, such as an etching process. For example, an etchant with an etching selectivity to the material of the fins 64 (e.g., the LDD regions 65) may be used to selectively remove top portions of the fin 64 (e.g., top portions of the LDD regions 65). As another example, a patterned mask layer (e.g., photoresist, not shown) may be formed over the FinFET device 100 to expose portions of the fins 64 on opposing sides of the gate structure, then an etching processing (e.g., an anisotropic etch) may be performed to remove top portions of the fins 64. The patterned mask layer may then be removed by, e.g., an ashing process or an etching process.

After the recessing process, an upper surface 65U of the fins 64 (e.g., a top surface of the LDD regions 65) is below an upper surface 86U of the spacers 86. In the example of FIG. 7A, the upper surface 65U of the remaining portions of the LDD regions 65 is substantially level with an upper surface 62U of the STI regions 62. In other embodiments, the upper surface of the remaining portions of the LDD regions 65 is above (see 65U') or below (see 65U") the upper surface 62U of the STI regions 62, as illustrated in phantom in FIG. 7A. As a result of the recessing process, recesses (or openings) are formed between respective spacers 86 (e.g., spacers on opposing sidewalls of a fin 64). A depth $H_R$ of the recess, measured between the upper surface 86U of the spacers 86 and the upper surface 65U of the remaining portions of the LDD regions 65, is in a range from about 30 nm to about 65 nm.

A cleaning process is performed after the recessing process to remove oxide from the fins 64 before a subsequent epitaxial growth process to form source/drain regions, in some embodiments. The cleaning process may be performed using a suitable etchant, such as hydrofluoric (HF) acid.

Next, the spacers 86 are treated with a baking process. The baking process removes byproducts or residues, such as chloride (Cl), fluoride (F), and/or carbon (C), that are left by the preceding processes (e.g., etching and/or cleaning processes), in some embodiments. The baking process also removes oxide (e.g., silicon oxide) that is over, e.g., the fins 64 in preparation for a subsequent epitaxial source/drain material growth process, in some embodiments.

For example, in accordance with some embodiments, the baking process is performed using a gas comprising molecular hydrogen (e.g., $H_2$). In some embodiments, the gas used in the baking process (may also be referred to as a baking gas) comprises a mixture of $H_2$ and one or more reactant gas(es). For example, a mixture of $H_2$ and HCl, or a mixture of $H_2$, HCl and $GeH_4$, may be used as the baking gas in the baking process. The HCl and/or GeH4 in the baking gas may help to clean the surface of, e.g., the fins 64 by etching a small amount of, e.g., silicon. In some embodiments, the baking process is performed in a processing chamber with the baking gas being supplied into the processing chamber. Carrier gases, such as nitrogen, argon, helium, or the like, may be used to carry the baking gas into the processing chamber. The baking process may be performed at a temperature in a range from about 650° C. to about 750° C., such as 680° C. A pressure in the processing chamber may be in a range from about 10 torr to about 80 torr. The baking process may be performed for a pre-determined duration, such as between about 10 seconds and about 90 seconds. In an exemplary embodiment, the baking process is performed for a duration between about 30 seconds and about 90 seconds. In embodiments where the baking gas comprises a mixture of $H_2$ and HCl, a flow rate of $H_2$ is in a range between about 3000 standard cubic centimeters per minute (sccm) and about 10000 sccm, and a flow rate of HCl is in a range between about 50 sccm and about 500 sccm. In embodiments where the baking gas comprises a mixture of $H_2$, HCl and $GeH_4$, a flow rate of $H_2$ is in a range between about 3000 sccm and about 10000 sccm, a flow rate of HCl is in a range between about 50 sccm and about 500 sccm, and a flow rate of $GeH_4$ is in a range between about 50 sccm and 200 sccm.

In accordance with some embodiments, native oxide such as silicon oxide over the fins 64 may be reduced to, e.g., silicon, by the reducing agent (e.g., $H_2$), and the byproduct(s) of the reduction process, such as water, is evaporated by the baking process and evacuated from the processing chamber. Byproducts from previous process steps, such as carbon, may also be removed by the baking process. A chemical equation describing the chemical reaction to remove the carbon is given below.

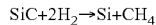

$$SiC+2H_2 \rightarrow Si+CH_4$$

The baking process changes the profile of the spacers 86, in some embodiments. In accordance with some embodiments, the baking process re-shapes the spacers 86. As illustrated in FIG. 7A, the inner sidewalls 86S of the spacers 86 are curved after the baking process. For example, the inner sidewalls 86S, or at least the middle portion of the inner sidewalls 86S, bend outwards and away from a center axis 64C of the fins 64, where the center axis 64C is perpendicular to an upper surface 50U of the substrate 50. In particular, a distance between middle portions of opposing inner sidewalls 86S increases after the re-shaping due to the baking process. For example, a first distance between the inner sidewalls 86S of respective spacers 86, measured after the baking process at a midpoint between the upper surface 86U and a lower surface 86L of the spacers 86, is larger than a second distance between the inner sidewalls 86S measured at the midpoint before the baking process.

FIG. 7B illustrates a zoomed-in view of the spacer 86 shown in FIG. 7A. As illustrated in FIG. 7B, the spacer 86 has a width $W_3$ at the upper surface 86U and a width $W_5$ at the lower surface 86L. Due to the curved inner sidewall 86S, the spacer 86 has a minimum width $W_4$ at point C, which corresponds to a point where the inner sidewall 86S extends furthest away from line M-N, where the line M-N is a line connecting the uppermost point M of the inner sidewall 86S and the lowermost point N of the inner sidewall 86S in FIG. 7B. In some embodiments, the width $W_3$ is between about 2 nm and about 5 nm, the width $W_5$ is between about 2 nm and 9 nm. The width $W_4$ may be between about 2 nm and about 5 nm. The height $H_2$ of the spacer 86 may be between about 5 nm and about 30 nm.

In some embodiments, an angle at between a ray $R_1$ and a ray $R_2$ is in a range between about 5 degrees and about 15 degrees, where $R_1$ is a ray from the uppermost point M of the inner sidewall 86S to the point C, and $R_2$ is a ray from the point M toward the lower surface 86L of the spacer 86, and where $R_2$ is perpendicular to the upper surface 50U (see FIG. 7A) of the substrate 50. Depending on the shape of the spacer 86, the ray $R_2$ may or may not overlap with the line M-N. The dimensions described above are merely non-limiting examples, other dimensions for the spacer 86 are also possible and are fully intended to be included within the scope of the present disclosure.

FIG. 7C illustrates another embodiment of the spacer 86 after the baking process. As illustrated in FIG. 7C, in addition to the inner sidewall 86S, the outer sidewall 860 of the spacer 86 may also be curved due to the baking process. In some embodiments, the conditions of the baking process, such as the temperature, the flow rate of the baking gas, the pressure, and/or the duration of the baking process, are adjusted to achieve a specific profile (e.g., straight or curved) for the outer sidewall 860 and/or the inner sidewall 86S of the spacer 86. Without being limited to a particular theory, it is believed that the amount of re-shaping of the spacer 86 may determine whether the outer sidewall 860 of the spacer 86 is curved (as illustrated in FIG. 7C) or substantially straight (as illustrated FIG. 7B). For example, it is observed that at a high temperature (e.g., >680° C.), the baking process is likely to reshape the spacer 86 such that the outer sidewall 860 is curved. In addition, the baking process may reduce the width of the spacer 86 at the upper surface 86U to a width $W_6$. In other words, the width $W_6$ of the spacer 86, measured at the upper surface 86U after the baking process, is smaller than the width $W_1$ (see FIG. 6B) of the spacer 86, measured at the upper surface 86U before the baking process.

Still referring to FIG. 7C, the curved inner sidewall 86S extends furthest from line M-N at point C, where line M-N is a line connecting the uppermost point M of the inner sidewall 86S and the lowermost point N of the inner sidewall 86S. A width of the spacer 86 measured at the point C is $W_7$, and a width of the spacer measured at the lower surface is $W_8$. In some embodiments, $W_6$ is smaller than $W_7$, and $W_7$ is smaller than $W_8$. In some embodiments, an angle at between a ray $R_1$ and a ray $R_2$ is in a range between about 5 degrees and about 15 degrees, where $R_1$ is a ray from the uppermost point M of the inner sidewall 86S to the point C, and $R_2$ is a ray from the point M toward the lower surface 86L of the spacer 86, and where $R_2$ is perpendicular to the upper surface 50U (see FIG. 7A) of the substrate 50. Depending on the shape of the spacer 86, the ray $R_2$ may or may not overlap with the line M-N.

In some embodiments, the width $W_6$ is between about 2 nm and about 5 nm, the width $W_8$ is between about 2 nm and 10 nm. The width $W_7$ may be between about 2 nm and about 7 nm. The height $H_3$ of the spacer 86 may be between about 5 nm and about 30 nm. The dimensions described above are merely non-limiting examples, other dimensions for the spacer 86 are also possible and are fully intended to be included within the scope of the present disclosure.

The curved inner sidewalls 86S, and/or the narrower width $W_6$ (if formed) at the upper surface of the spacer 86, facilitate horizontal growth of the epitaxial source/drain regions 80 (see FIG. 8A) in subsequent processing, and therefore, results in merged source/drain regions 80 with increased volumes over the multiple fins 64. More details are discussed hereinafter with reference to FIG. 8A. The increased volume of the merged source/drain regions 80 allows for reliable connection with source/drain contact plugs 102 (see FIG. 15B) formed subsequently, lowers contact resistance, and reduces the possibility of etch through of the source/drain regions 80 during formation of the source/drain contact plugs 102, in some embodiments.

Next, as illustrated in FIG. 8A, source/drain regions 80 are formed by epitaxially growing a material in the recesses between spacers 86, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. FIG. 8B illustrates the FinFET device 100 of FIG. 8A, but along cross-section A-A.

As illustrated in FIG. 8A, the epitaxial source/drain regions 80 fill the recesses between spacers 86, and extend over the upper surface 86U of the spacers 86. In the illustrated embodiment, the source/drain regions 80 of adjacent fins 64 merge to form a continuous epitaxial source/drain region 80 that connects the multiple fins 64 of the FinFET device 100.

As illustrated in FIG. 8A, the source/drain regions 80 comprise curved lower surfaces 80L. The curved lower surfaces 80L increase the volume of the source/drain regions 80. The curved lower surfaces 80L also result in merged source/drain regions 80 with increased thickness (e.g., $D_1$ and $D_2$). For example, a thickness $D_2$ of the source/drain region 80, measured midway between two adjacent fins 64, is in a range from about 15 nm to about 35 nm. A thickness $D_1$ of the source/drain region 80, measured along the center axis 64C (see FIG. 7A) of the fin 64 and over the spacer 86, is in a range from about 25 nm to about 45 nm, in some embodiments. A fin pitch P may be in a range from about 25 nm to about 85 nm. A ratio of $D_1$ to $D_2$ is larger than 0.8, e.g., between about 0.8 and 3, and a ratio of $D_2$ to the fin pitch P, is in a range between about 0.2 and 0.6, in various embodiments.

Still referring to FIG. 8A, the merged source/drain regions 80 comprise slanted upper surfaces (e.g., 80S) that are substantially planar. The slanted planar upper surfaces 80S may also be referred to as facets of the source/drain regions 80. Therefore, the merged source/drain regions 80 have curved lower surfaces 80L and slated planar upper surfaces 80S, in some embodiments. In addition, FIG. 8A also illustrates a substantially flat upper surface (e.g., 80U) between slanted planar upper surfaces 80S, where the upper surface 80U is substantially parallel to the upper surface 50U of the substrate 50. In some embodiments, the upper surface 80U has a curved shape (e.g., a concave curved upper surface, not shown).

Since the source/drain regions 80 fill the recesses between respective spacers 86, the source/drain regions 80 have a width $D_5$ at the lower surface of the spacers 86, a width $D_4$ at the upper surface of the spacers 86, and a width $D_3$ between (e.g., midway between) the upper surface and the lower surface of the spacers 86. In the illustrated example, $D_3$ is large than $D_4$ and $D_5$. In some embodiments, $D_3$ is in a range from about 5 nm to about 30 nm, $D_4$ is in a range from about 5 nm to about 25 nm, and $D_5$ is in a range from about 5 nm to about 25 nm, although other dimension are also possible. As illustrated in FIG. 8A, ray $R_1$ and ray $R_2$ form an angle α between about 90 degrees and about 150 degrees (e.g., 90°≤α≤150°), where ray $R_1$ and ray $R_2$ start at a point where the lower surface 80L of the source/drain region 80 intersects (e.g., contacts) the spacers 86, and where ray $R_2$ is perpendicular to the upper surface 50U of the substrate 50, and ray $R_1$ is tangent to the lower surface 80L.

In some embodiments, the resulting FinFET device 100 is an n-type FinFET, and source/drain regions 80 of the fins 64 comprise silicon carbide (SiC), silicon phosphorous (SiP), phosphorous-doped silicon carbon (SiCP), or the like. In some embodiments, the resulting FinFET device 100 is a p-type FinFET, and source/drain regions 80 of the fins 64 comprise SiGe, and a p-type impurity such as boron or indium.

The epitaxial source/drain regions 80 may be implanted with dopants to form source/drain regions 80 followed by an anneal process. The source/drain regions 80 may have an impurity (e.g., dopant) concentration in a range from about 1E19 cm-3 to about 1E21 cm-3. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

In some embodiments, a composition of a lower portion (e.g., a portion of 80 between the upper surface of the STI regions 62 and the upper surface 86U of the spacers 86) of the source/drain region 80 is different from a composition of an upper portion (e.g., a portion of 80 above the upper surface 86U of the spacers 86) of the source/drain region 80. In an exemplary embodiment, the upper portion of the source/drain region 80 has a higher dopant concentration than that of the lower portion of the source/drain region 80. As an example, consider the case where the FinFET device is a n-type FinFET and the source/drain region 80 comprises SiP, the concentration of P for the lower portion of the source/drain region 80 may be between about $1E20/cm^3$ and about $1E21/cm^3$, and the concentration of P for the higher portion of the source/drain region 80 may be between about $1E21/cm^3$ and about $5E21/cm^3$. As another example, consider the case where the FinFET device is an P-type FinFET and the source/drain region 80 comprises SiGe doped by boron (B), the concentration of B for the lower portion of the source/drain region 80 may be between about $1E20/cm^3$ and about $5E20/cm^3$, and the concentration of B for the upper portion of the source/drain region 80 may be between about $2E20/cm^3$ and about $1E21/cm^3$. In addition, an atomic percentage of Ge of the source/drain region 80 (e.g., SiGe doped by B) in the lower portion may be between about 15% and about 30%, and an atomic percentage of Ge of the source/drain region 80 in the upper portion may be between about 30% and about 60%.

Figure 9:
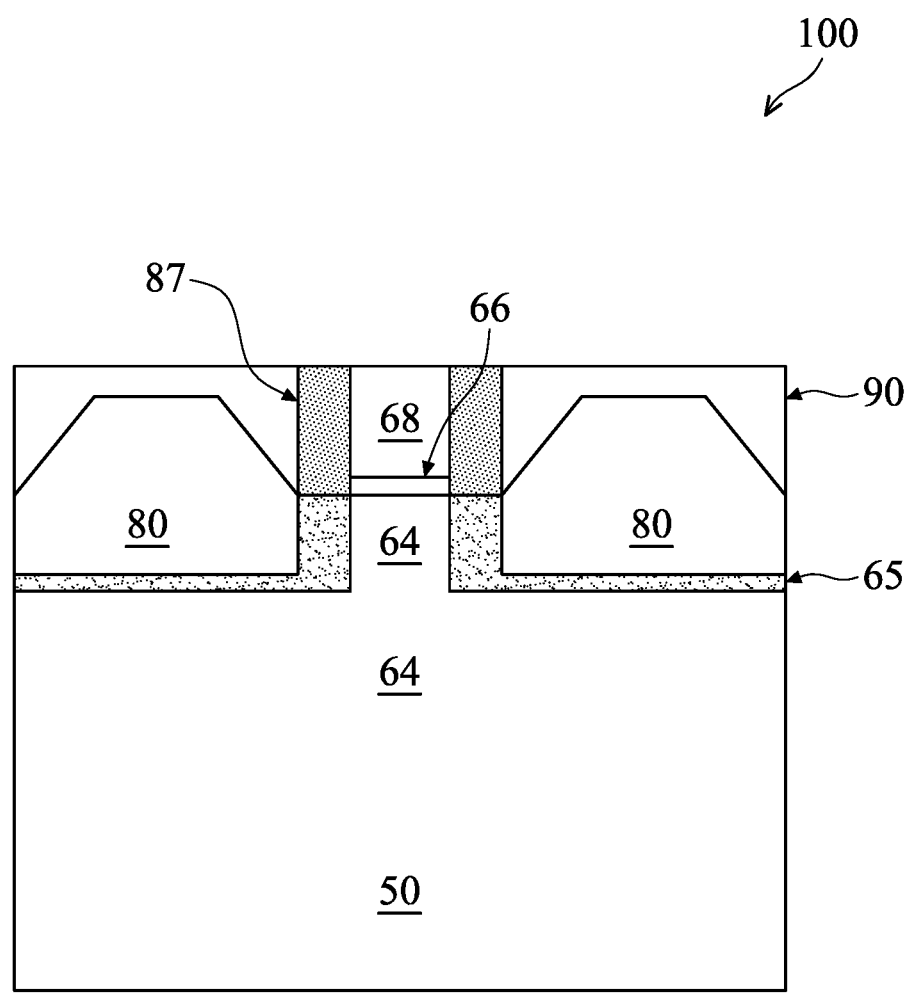

Next, as illustrated in FIG. 9, a first interlayer dielectric (ILD) 90 is formed over the source/drain regions 80, the fins 64, and the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70, and to planarize the top surface of the first ILD 90 such that the top surface of the first ILD 90 is level with the top surface of the gate 68.

Next, an embodiment gate-last process (sometimes referred to as replacement gate process) is performed subsequently to replace the gate 68 and the gate dielectric 66 with active gates and active gate dielectric materials. Therefore, the gate 68 and the gate dielectric 66 are considered dummy gate structures in a gate-last process. Details of the embodiment gate-last process are described hereinafter with reference to FIGS. 10-14, 15A and 15B.

Figure 10:
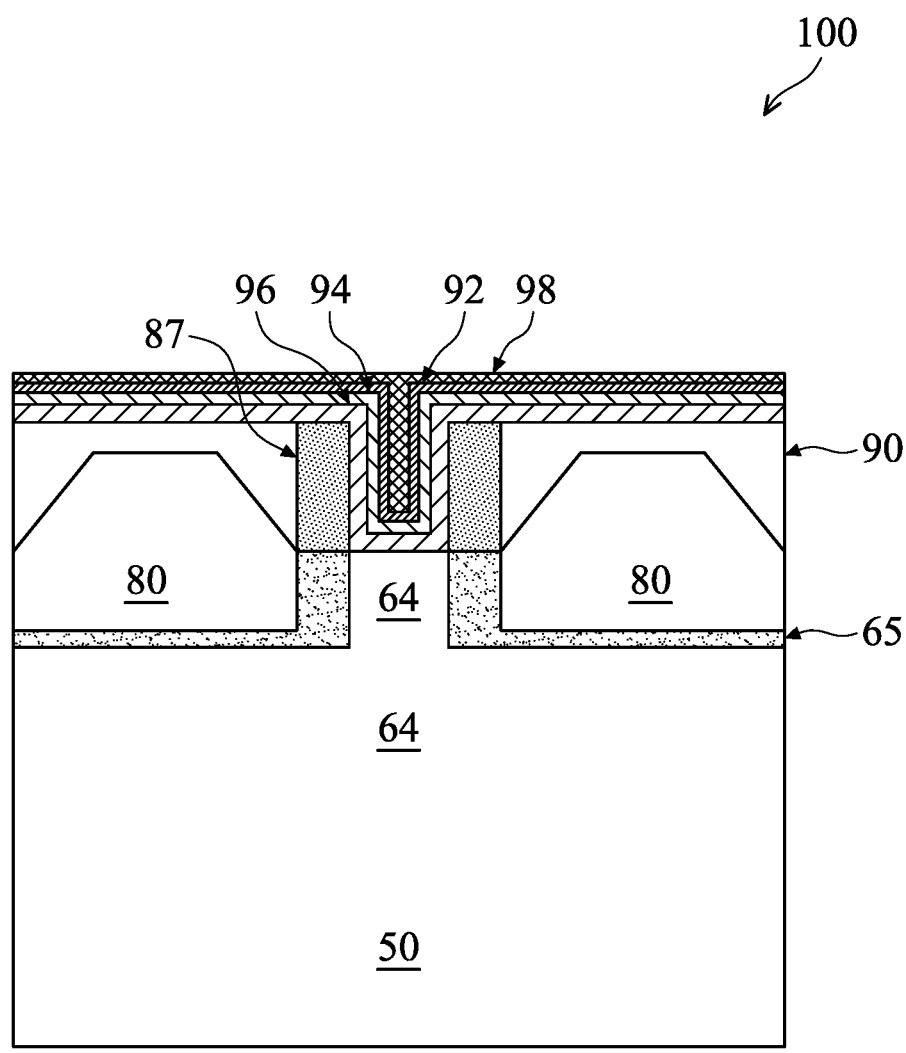

Referring now to FIG. 10, the gate 68 and the gate dielectric 66 directly under the gate 68 are removed in an etching step(s), so that recesses (not shown) are formed between respective gate spacers 87. Each recess exposes a channel region of a respective fin 64. Each channel region is disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Figure 11:
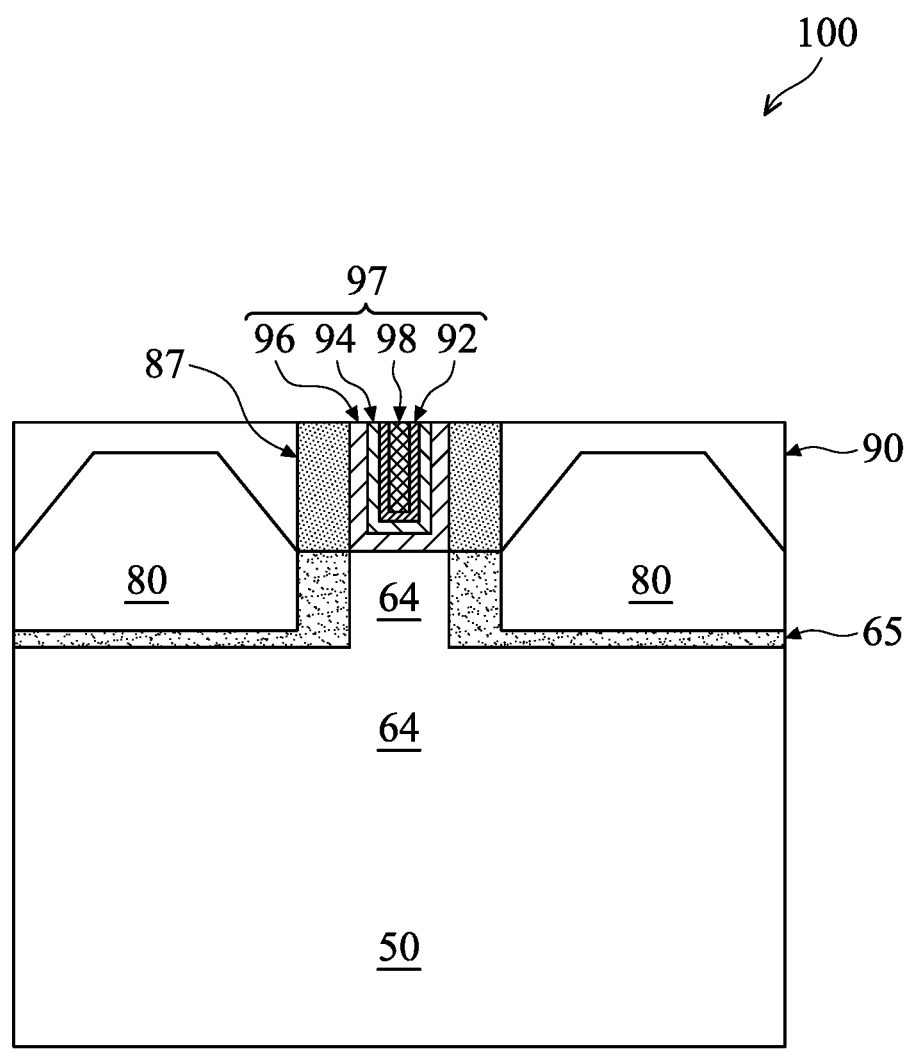

Next, a gate dielectric layer 96, a barrier layer 94, a seed layer 92, and a gate electrode 98 are formed for replacement gate 97 (see FIG. 11). The gate dielectric layer 96 is deposited conformally in the recesses, such as on the top surfaces and the sidewalls of the fins 64 and on sidewalls of the gate spacers 87, and on a top surface of the first ILD 90. In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the barrier layer 94 is formed conformally over the gate dielectric layer 96. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as plasma-enhanced CVD (PECVD). However, other alternative processes, such as sputtering or metal organic chemical vapor deposition (MOCVD), atomic layer deposition (ALD), may alternatively be used.

Although not illustrated in FIG. 10, work function layers may be formed in the replacement gate 97, e.g., over the barrier layer 94. For example, P-type work function layer(s) may be formed for P-type devices, and N-type work function layer(s) may be formed for N-type devices. Exemplary P-type work function metals that may be included in the gate structure (e.g., 97) include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structure include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device to be formed. The work function layer(s) may be deposited by CVD, physical vapor deposition (PVD), and/or other suitable process.

Next, the seed layer 92 is formed over the barrier layer 94 (or the work function layers if formed). The seed layer 92 may include copper (Cu), titanium (Ti), tantalum (Ta), titanium nitride (TiN), tantalum nitride (TaN), the like, or a combination thereof, and may be deposited by atomic layer deposition (ALD), sputtering, physical vapor deposition (PVD), or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer.

Next, the gate electrode 98 is deposited over the seed layer 92, and fills the remaining portions of the recesses. The gate electrode 98 may be made of a metal-containing material such as TiN, TaN, TaC, Co, Ru, Al, combinations thereof, or multilayers thereof, and may be formed by, e.g., electroplating, electroless plating, or other suitable method.

Next, as illustrated in FIG. 11, after the formation of the gate electrode 98, a planarization process, such as a CMP, may be performed to remove the excess portions of the gate dielectric layer 96, the barrier layer 94, the work function layer(s) (if formed), the seed layer 92, and the material of the gate electrode 98, which excess portions are over the top surface of first ILD 90. The resulting remaining portions of material of the gate electrode 98, the seed layer 92, the work function layer(s) (if formed), the barrier layer 94, and the gate dielectric layer 96 thus form a replacement gate 97 of the resulting FinFET device 100.

Figure 12:
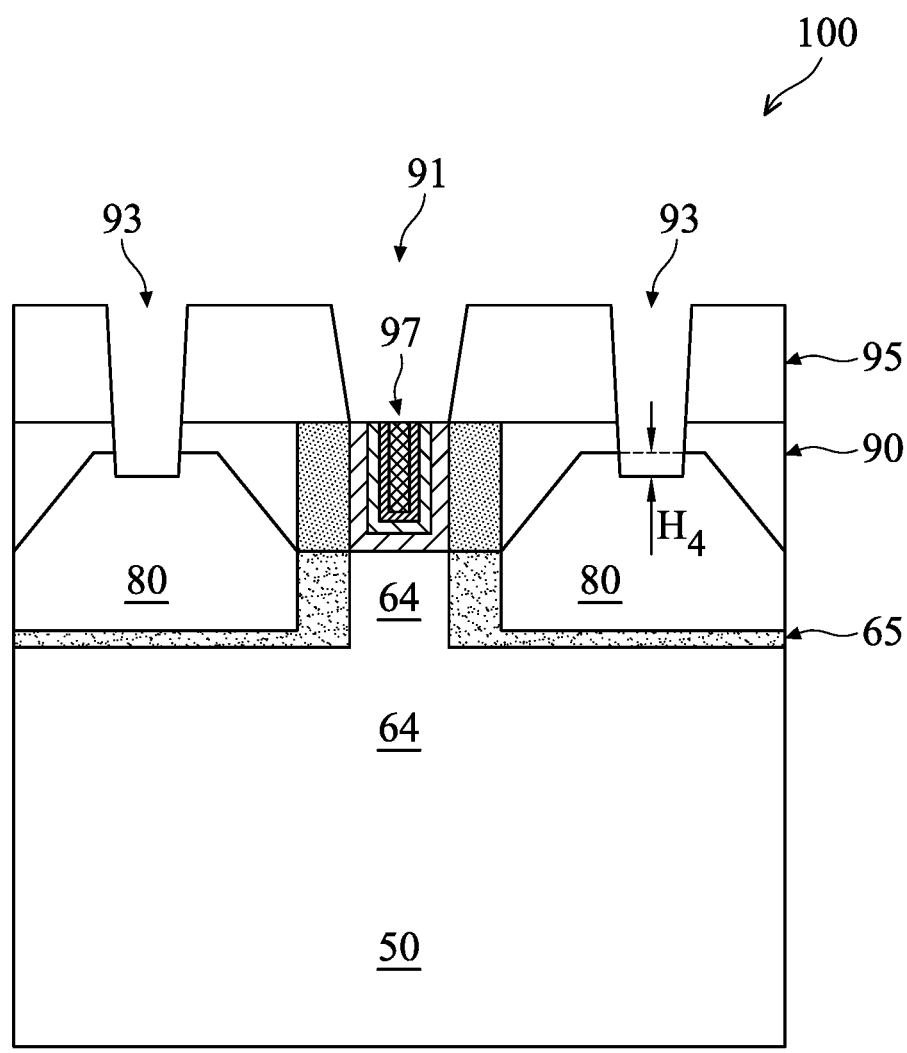

Next, in FIG. 12, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Contact openings 91 and 93 for contact plugs 102 (see FIG. 15A) are formed through the first ILD 90 and/or the second ILD 95. For example, the contact opening 91 is formed through the second ILD 95 and exposes the replacement gate 97, while the contact openings 93 are formed through the first ILD 90 and the second ILD 95, and exposes source/drain regions 80.

In advanced processing nodes, due to the high ratio of fin height to fin pitch, contact openings 91/93 may be formed to extend into the source/drain regions 80, as illustrated in FIG. 12, to ensure good contact between the subsequently formed contact plugs and the source/drain regions 80. A depth of the openings $H_4$ may be in a range between about 15 nm to about 25 nm, as examples.

Figure 13:
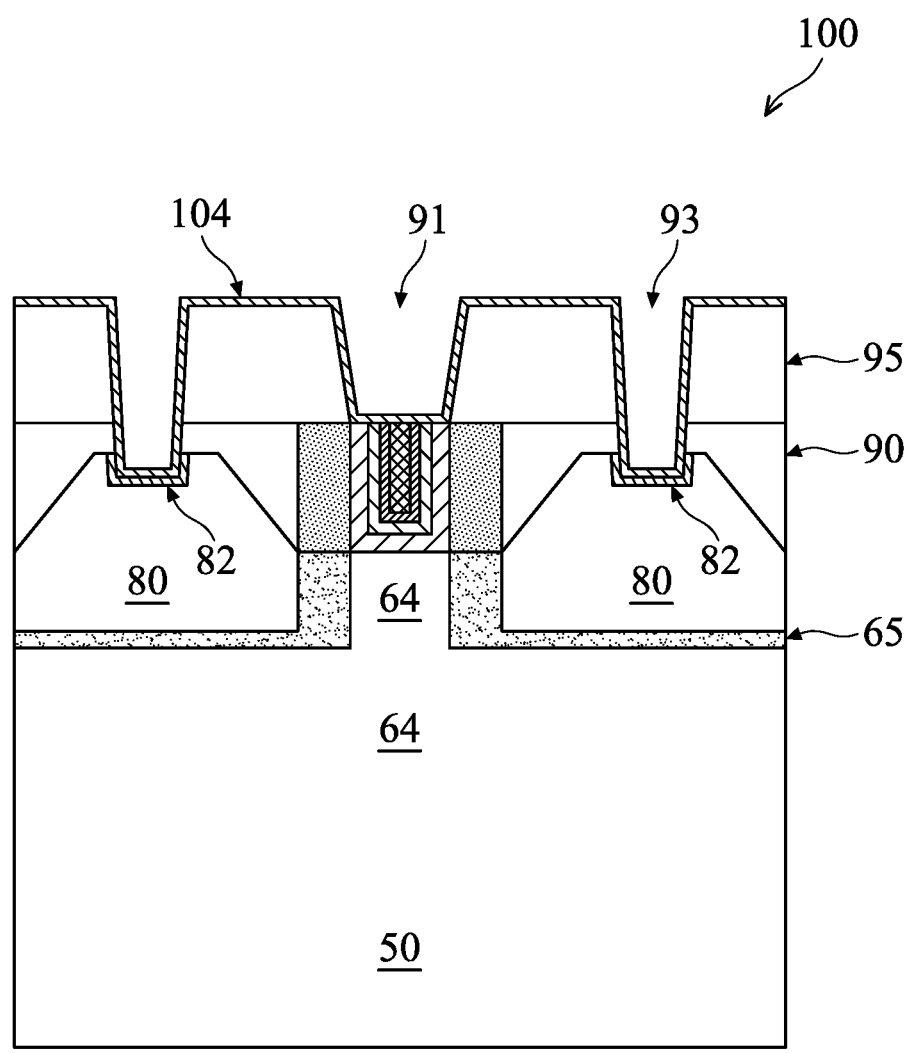

Next, in FIG. 13, silicide regions 82 are formed over the source/drain regions 80, and a barrier layer 104 is formed over the silicide regions 82 and the second ILD 95. In some embodiments, the silicide regions 82 are formed by depositing, over the source/drain regions 80, a metal capable of reacting with semiconductor materials (e.g., silicon, germanium) to form silicide or germanide regions. The metal may be nickel, cobalt, titanium, tantalum, platinum, tungsten, other noble metals, other refractory metals, rare earth metals or their alloys. A thermal anneal process is then performed so that the deposited metal reacts with the source/drain regions 80 to form silicide regions 82. After the thermal anneal process, the unreacted metal is removed.

The barrier layer 104 is conformally formed over the silicide regions 82 and the second ILD 95, and lines sidewalls and bottoms of the contact openings 91/93. The barrier layer 104 may comprise an electrically conductive material such as titanium (Ti), titanium nitride (TiN), tantalum (Ta), tantalum nitride (TaN), or the like, and may be formed using a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used.

Figure 14:
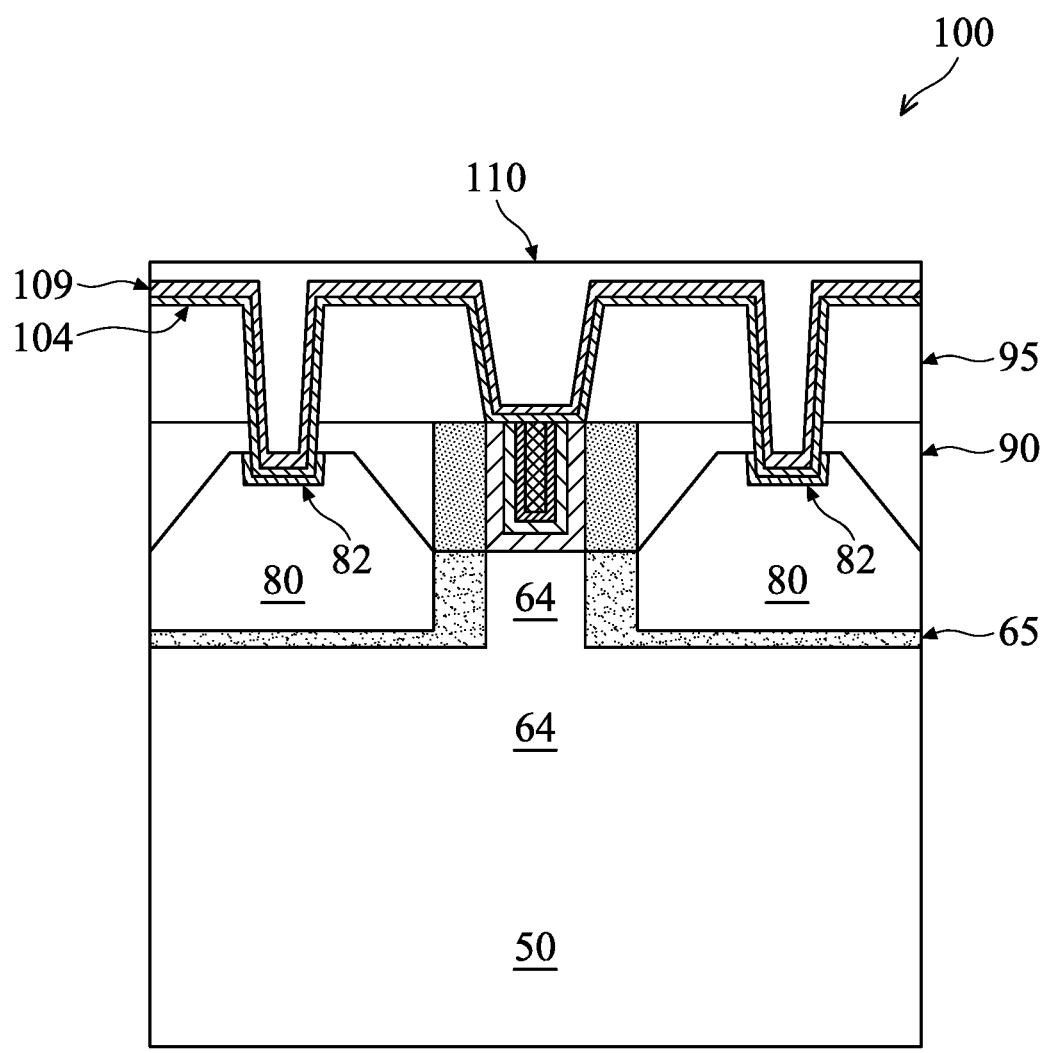

Next, in FIG. 14, a seed layer 109 is formed over the barrier layer 104, and an electrically conductive material 110 is formed over the seed layer 109. The seed layer 109 may be deposited by PVD, ALD or CVD, and may be formed of tungsten, copper, or copper alloys, although other suitable methods and materials may alternatively be used.

Once the seed layer 109 has been formed, the conductive material 110 may be formed onto the seed layer 109 to fill the contact openings 91/93. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Figure 15A:
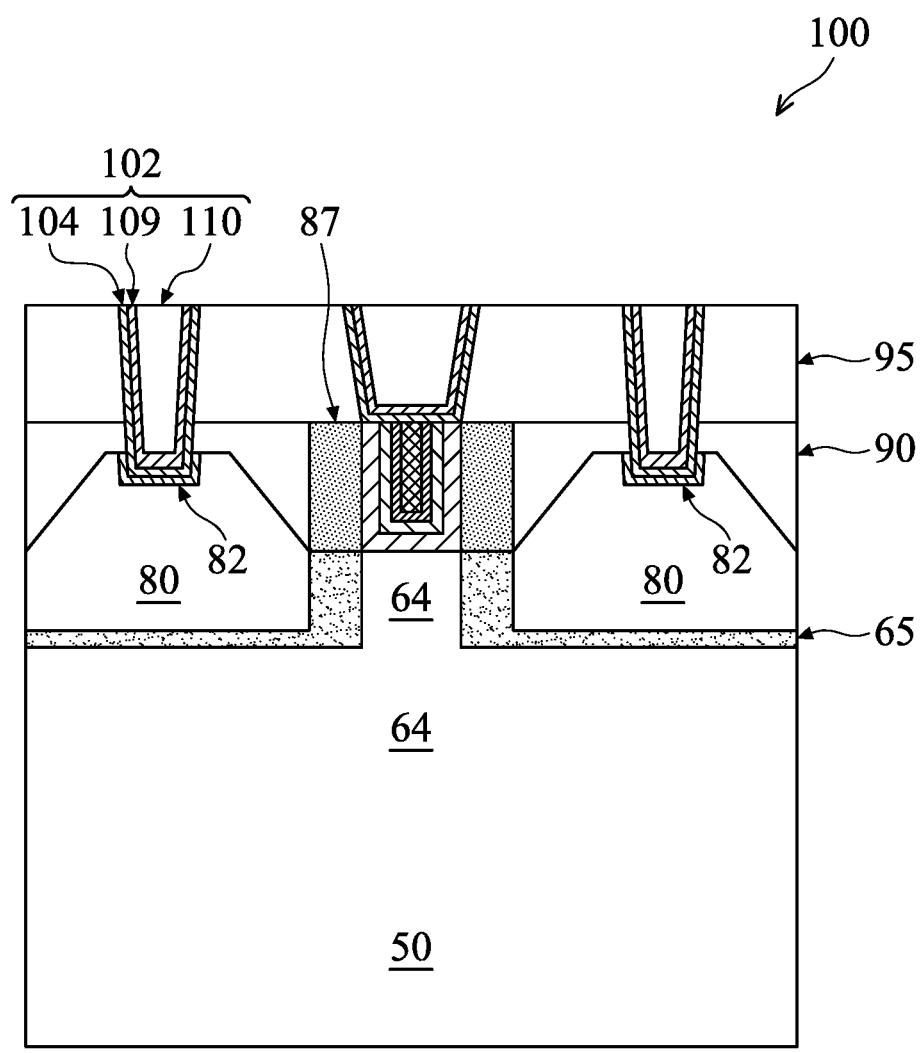
Figure 15B:
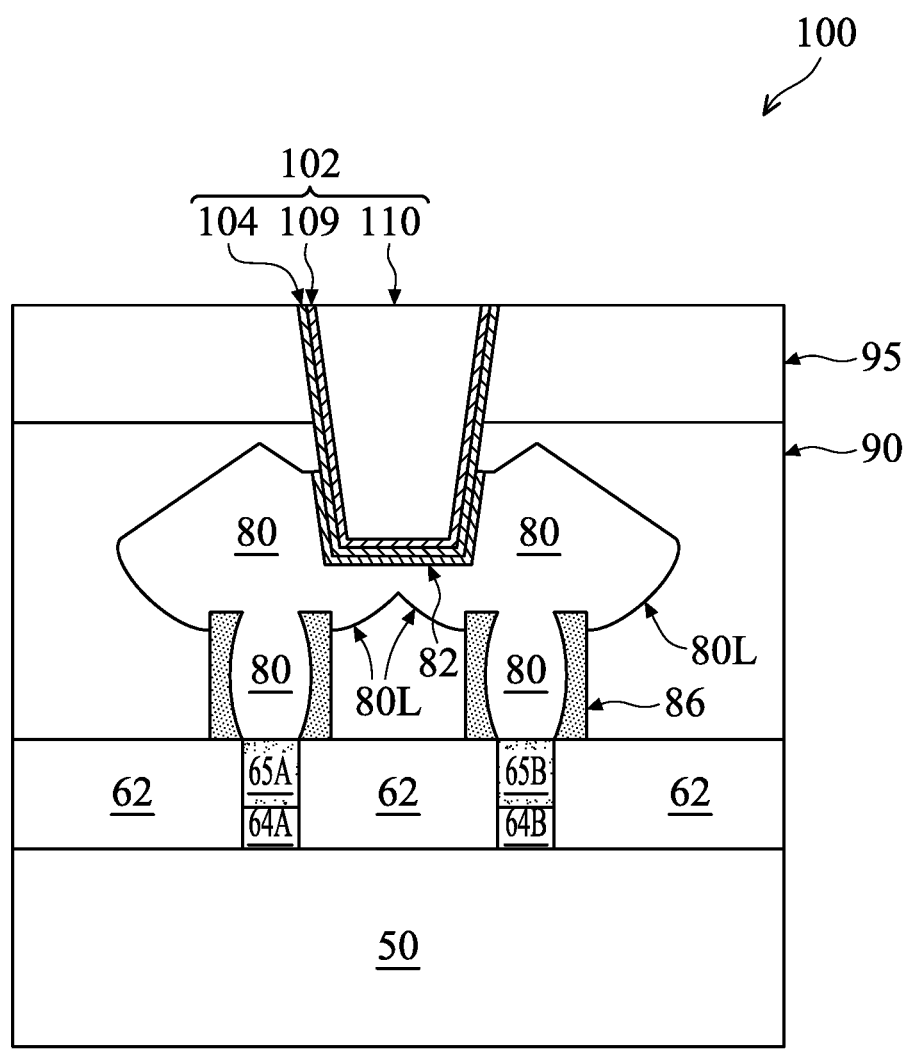

Referring next to FIG. 15A, once the contact openings 91/93 have been filled, excess portions of the barrier layer 104, the seed layer 109, and the conductive material 110 outside of the contact openings 91/93 may be removed through a planarization process such as CMP, although any suitable removal process may be used. Contact plugs 102 are thus formed in the contact openings 91/93. Although contact plugs 102 over the source/drain regions 80 and over the replacement gate 97 are illustrated in a same cross-section in FIG. 15A, the contact plugs 102 may be in different cross-sections in the FinFET device 100.

FIG. 15B illustrates the FinFET device 100 in FIG. 15A, but along cross-section C-C. As discussed earlier, in advanced processing nodes, the contact openings, and hence the contact plugs 102, may extend into the source/drain regions 80. The current disclosed embodiments produces merged source/drain regions 80 with increased thickness, e.g., $D_2$ (see FIG. 8A). The increased thickness of the merged source/drain regions 80 reduces or eliminates the possibility of over etching (e.g., contact holes 91/93 becoming through-holes in the source/drain regions 80) in forming the contact openings 91/93. Over etching of the contact openings 91/93 may result in the contact plugs 102 not being formed properly, or the contact plugs 102 extending through the source/drain regions 80, which may result in higher contact resistance and/or device failure. The disclosed embodiments, therefore, avoid these issues and provide improved production yield and better device performance.

Figure 16:
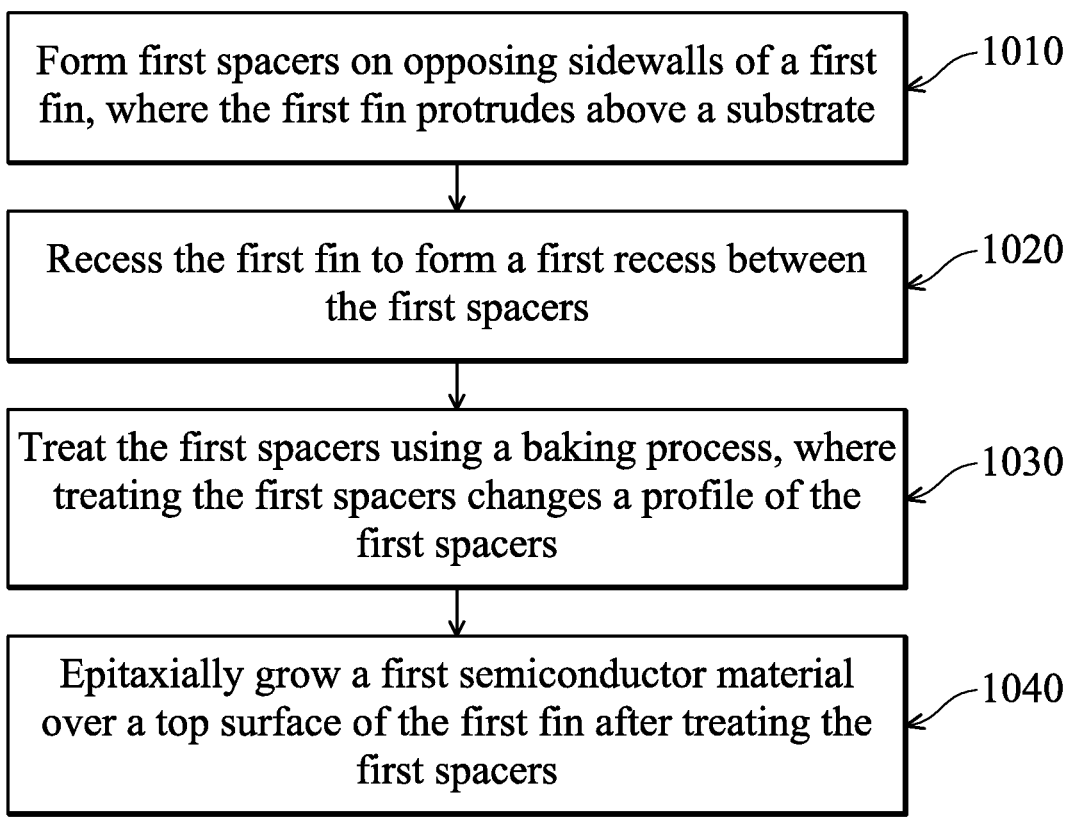
FIG. 16 illustrates a flow chart of a method for forming a semiconductor device, in some embodiments.

FIG. 16 illustrates a flow chart of a method of forming a semiconductor device, in accordance with some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged and repeated.

Referring to FIG. 16, at step 1010, first spacers are formed on opposing sidewalls of a first fin, where the first fin protrudes above a substrate. At step 1020, the first fin is recessed to form a first recess between the first spacers. At step 1030, the first spacers are treated using a baking process, where treating the first spacers changes a profile of the first spacers. At step 1040, a first semiconductor material is epitaxially grown over a top surface of the first fin.

Embodiments may achieve advantages. For example, the baking process not only removes oxide from the recesses between spacers to facilitate growth of the epitaxial source/drain material, but also re-shapes the spacers to facilitate horizontal growth of the epitaxial source/drain material. As a result, the merged epitaxial source/drain regions have increased volume and increased thickness, which results in lower contact resistance and more reliable contact with contact plugs formed subsequently. The thicker source/drain regions prevents or reduces the possibility of over etching in forming the contact openings, which in turn prevents or reduces the possibility of the contact plugs being formed incorrectly or being formed through the source/drain regions, thereby improving device performance and increasing production yields.

In an embodiment, a method includes forming first spacers on opposing sidewalls of a first fin, where the first fin protrudes above a substrate; recessing the first fin to form a first recess between the first spacers; treating the first spacers using a baking process, where treating the first spacers changes a profile of the first spacers; and epitaxially growing a first semiconductor material over a top surface of the first fin after treating the first spacers. In an embodiment, the baking process is performed using a gas comprising hydrogen. In an embodiment, the baking process is performed at a temperature in a range between about 650° C. and about 750° C. In an embodiment, the baking process is performed in a pressure in a range between about 10 torr and about 80 torr. In an embodiment, the baking process is performed for a duration between about 10 seconds and about 90 seconds. In an embodiment, treating the first spacers curves inner sidewalls of the first spacers such that a first distance between the inner sidewalls of the first spacers, measured after the treating at a midpoint of the inner sidewalls of the first spacers between an upper surface of the first spacers and a bottom surface of the first spacers, is larger than a second distance between the inner sidewalls of the first spacers measured at the midpoint before the treating. In an embodiment, treating the first spacers further reduces a width of the first spacers measured at the top surface of the first spacers. In an embodiment, the baking process reduces an oxide in the first recess using a reducing agent, where the method further comprises performing an oxide removal process after recessing the first fin and before treating the first spacers. In an embodiment, performing the oxide removal process uses hydrofluoric acid. In an embodiment, the method further includes forming second spacers on opposing sidewalls of a second fin; recessing the second fin to form a second recess between the second spacers; treating the second spacers using the baking process, where treating the second spacers changes a profile of the second spacers; and epitaxially growing a second semiconductor material over a top surface of the second fin, where the first semiconductor material and the second semiconductor material merge to form a continuous semiconductor region between the first fin and the second fin. In an embodiment, a lower surface of the continuous semiconductor region is curved, and an upper surface of the continuous semiconductor region is planar.

In an embodiment, a method includes forming first spacers on opposing sidewalls of a first fin; forming second spacers on opposing sidewalls of a second fin; recessing the first fin and the second fin, where the recessing forms a first recess between the first spacers and a second recess between the second spacers; re-shaping the first spacers and the second spacers; and growing an epitaxial material in the first recess and the second recess. In an embodiment, the re-shaping bends first inner sidewalls of the first spacers and second inner sidewalls of the second spacers, where a distance between middle portions of the first inner sidewalls increases during the re-shaping, and a distance between middle portions of the second inner sidewalls increases during the re-shaping. In an embodiment, the re-shaping reduces a first width of the first spacers measured at a top surface of the first spacers, where the re-shaping reduces a second width of the second spacers measured at a top surface of the second spacers. In an embodiment, the re-shaping comprises a baking process. In an embodiment, the baking process is performed in an environment comprising hydrogen at a temperature between about 650° C. and about 750° C. In an embodiment, the epitaxial material extends over the first spacers and the second spacers, where the epitaxial material over the first fin and the second fin merge to form a semiconductor region extending continuously from the first fin to the second fin, and where a lower surface of the semiconductor region is curved.

In an embodiment, a Fin Field-Effect Transistor (FinFET) device includes a first fin and a second fin; first spacers on opposing sides of the first fin, where inner sidewalls of the first spacers bend away from a longitudinal axis of the first fin; second spacers on opposing sides of the second fin, where inner sidewalls of the second spacers bend away from a center axis of the second fin; and a semiconductor material between the first spacers and between the second spacers, the semiconductor material extending continuously from the first fin to the second fin. In an embodiment, the semiconductor material has a curved lower surface. In an embodiment, the semiconductor material has a slanted planar upper surface.

In an embodiment, a semiconductor device includes a first fin and a second fin protruding above a substrate; and a semiconductor material over the first fin and the second fin, the semiconductor material extending continuously from the first fin to the second fin, the semiconductor material having a curved lower surface and a slanted planar upper surface. In an embodiment, the semiconductor material further has a substantially flat upper surface between the first fin and the second fin. In an embodiment, the semiconductor material has a first portion over and contacting the first fin, a second portion over and contacting the first portion, and a third portion over and contacting the second portion, where the second portion has a second width larger than a first width of the first portion, and the third portion has a third width smaller than the second width. In an embodiment, the semiconductor device further includes first spacers on opposing sides of the first fin, where the first spacers have inner sidewalls that are curved, and where a distance between middle portions of the inner sidewalls of the first spacers is larger than a distance between end portions of the inner sidewalls of the first spacers.

In an embodiment, a method of forming a semiconductor device includes recessing a first fin; recessing a second fin; and growing an epitaxial material over the first fin and over the second fin, where growing the epitaxial material forms a first portion of the epitaxial material over the first fin and over the second fin, forms a second portion of the epitaxial material over the first portion, forms a third portion of the epitaxial material over the second portion, and forms a fourth portion of the epitaxial material over the third portion, where the first portion has a first width smaller than a second width of the second portion, and the third portion has a third width smaller than the second width, and where the third portion comprises two separate regions, and the fourth portion extends continuously from the first fin to the second fin. In an embodiment, the fourth portion has a curved lower surface. In an embodiment, the method further includes forming first spacers on opposing sides of the first fin; forming second spacers on opposing sides of the second fin; and curving first inner sidewalls of the first spacers and second inner sidewalls of the second spacers before growing the epitaxial material. In an embodiment, the curving comprises performing a baking process using a gas comprising molecular hydrogen.

In an embodiment, a method of forming a Fin Field-Effect Transistor (FinFET) device includes forming a plurality of fins; forming spacers along sidewalls of each of the plurality of fins; recessing the plurality of fins; re-shaping the spacers of each of the plurality of fins; and epitaxially growing a semiconductor material over each of the plurality of fins, where the semiconductor material continuously connects the plurality of fins, and where a lower surface of the semiconductor material is curved. In an embodiment, an upper surface of the semiconductor material is planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming first spacers on opposing sidewalls of a first fin, wherein the first fin protrudes above a substrate;
   recessing the first fin to form a first recess between the first spacers;
   performing a cleaning process after recessing the first fin;
   after the cleaning process, performing a baking process to change a profile of the first spacers, wherein the baking process is performed using a gas mixture comprising hydrogen, hydrofluoric acid, and germanium hydride, wherein the baking process curves inner sidewalls of the first spacers facing the first fin; and
   forming a first semiconductor material over a top surface of the first fin after the baking process.

2. The method of claim 1, wherein the cleaning process removes oxide from the first fin.

3. The method of claim 2, wherein the cleaning process is performed using hydrofluoric acid.

4. The method of claim 1, wherein outer sidewalls of the first spacers facing away from the first fin are straight after the baking process.

5. The method of claim 4, wherein a distance between the inner sidewalls of the first spacers has a first value at a top surface of the first spacers distal from the substrate, a second value at a bottom surface of the first spacers facing the substrate, and a third value midway between the top surface and the bottom surface, wherein the third value is larger than the first value and the second value.

6. The method of claim 1, wherein recessing the first fin comprises recessing the top surface of the first fin below an upper surface of an isolation region adjacent to the first fin.

7. The method of claim 1, wherein recessing the first fin comprises recessing the top surface of the first fin such that the top surface of the first fin extends further from the substrate than an upper surface of an isolation region adjacent to the first fin.

8. The method of claim 1, wherein forming the first semiconductor material comprises epitaxially growing a source/drain material over the top surface of the first fin.

9. The method of claim 1, wherein the baking process curves outer sidewalls of the first spacers facing away from the first fin.

10. The method of claim 9, wherein the baking process is performed at a temperature higher than about 680° C.

11. The method of claim 9, wherein a distance between the inner sidewalls of the first spacers has a first value at a top surface of the first spacers distal from the substrate, a second value at a bottom surface of the first spacers facing the substrate, and a third value at a location midway between the top surface and the bottom surface, wherein the third value is larger than the first value, and the second value is larger than the third value.

12. The method of claim 1, further comprising:
forming second spacers on opposing sidewalls of a second fin;
recessing the second fin to form a second recess between the second spacers;
treating the second spacers using the baking process, wherein treating the second spacers changes a profile of the second spacers; and
forming a second semiconductor material over a top surface of the second fin, wherein the first semiconductor material and the second semiconductor material merge to form a continuous semiconductor region between the first fin and the second fin.

13. A Fin Field-Effect Transistor (FinFET) device comprising:
a fin protruding above a substrate;
isolation regions on opposing sides of the fin;
a gate structure over the fin;
a source/drain region over the fin and on a first side of the gate structure; and
spacers on opposing sides of the fin and on the first side of the gate structure, wherein the source/drain region has a lower portion disposed between the spacers and has an upper portion over the lower portion, wherein the lower portion of the source/drain region has a first width measured at an upper surface of the spacers distal from the substrate, a second width measured at a lower surface of the spacers facing the substrate, and a third width measured at a location midway between the upper surface of the spacers and the lower surface of the spacers, wherein the third width is larger than the first width and the second width.

14. The FinFET device of claim 13, wherein a lower surface of the lower portion of the source/drain region facing the substrate is closer to the substrate than an upper surface of the isolation regions distal from the substrate.

15. The FinFET device of claim 13, wherein a lower surface of the lower portion of the source/drain region facing the substrate is further from the substrate than an upper surface of the isolation regions distal from the substrate.

16. The FinFET device of claim 13, wherein the spacers have inner sidewalls facing the source/drain region and have outer sidewalls facing away from the source/drain region, wherein the inner sidewalls are curved, and the outer sidewalls are straight.

17. The FinFET device of claim 16, wherein the lower portion of the source/drain region fills a space between the inner sidewalls of the spacers.

18. A Fin Field-Effect Transistor (FinFET) device comprising:
a first fin and a second fin protruding above a substrate;
first spacers on opposing sides of the first fin, the first spacers having non-uniform thicknesses, wherein inner sidewalls of the first spacers facing the first fin are curved, and outer sidewalls of the first spacer facing away from the first fin are straight, wherein a thickness of the first spacers has a first value measured at an upper surface of the first spacers distal from the substrate, a second value measured at a lower surface of the first spacers opposing the upper surface, and a third value measured midway between the upper surface and the lower surface of the first spacers, wherein the third value is smaller than the first value and the second value;
second spacers on opposing sides of the second fin, wherein inner sidewalls of the second spacers are curved; and
a semiconductor material between the first spacers and between the second spacers, the semiconductor material extending continuously from the first fin to the second fin.

19. The FinFET device of claim 18, wherein the semiconductor material has a curved lower surface and a flat upper surface.

20. The FinFET device of claim 19, wherein the semiconductor material has a first thickness measured along a center axis of the first fin, and has a second thickness measured at a location laterally between the first fin and the second fin, wherein the second thickness is smaller than the first thickness.

* * * * *

UNITED STATES PATENT AND TRADEMARK OFFICE
CERTIFICATE OF CORRECTION

PATENT NO.       : 10,510,868 B2
APPLICATION NO.  : 16/511580
DATED            : December 17, 2019
INVENTOR(S)      : Yi-Jing Lee Page 1 of 1

It is certified that error appears in the above-identified patent and that said Letters Patent is hereby corrected as shown below:

On the Title Page

Item (73) Assignee, Line 2, delete "Manufacutring" and insert --Manufacturing--.

Signed and Sealed this
Seventh Day of April, 2020

Andrei Iancu
*Director of the United States Patent and Trademark Office*